(12) United States Patent
Bovo et al.

(10) Patent No.: US 8,906,453 B2
(45) Date of Patent: Dec. 9, 2014

(54) TOOL FOR HARVESTING POLYCRYSTALLINE SILICON-COATED RODS FROM A CHEMICAL VAPOR DEPOSITION REACTOR

(75) Inventors: Rodolfo Bovo, Merano (IT); Paolo Molino, Merano (IT); Diego Gava, Merano (IT)

(73) Assignee: MEMC Electronics Materials, S.p.A., Novara (IT)

( * ) Notice: Subject to any disclaimer, the term of this patent is extended or adjusted under 35 U.S.C. 154(b) by 162 days.

(21) Appl. No.: 13/418,979

(22) Filed: Mar. 13, 2012

(65) Prior Publication Data

US 2012/0237678 A1 Sep. 20, 2012

Related U.S. Application Data

(60) Provisional application No. 61/453,996, filed on Mar. 18, 2011.

(51) Int. Cl.
| | |
|---|---|
| *C23C 16/00* | (2006.01) |
| *C23C 16/24* | (2006.01) |
| *C23C 16/44* | (2006.01) |
| *C01B 33/035* | (2006.01) |
| *B05C 11/00* | (2006.01) |
| *B05C 13/00* | (2006.01) |
| *B05C 13/02* | (2006.01) |
| *B29C 63/00* | (2006.01) |
| *B03B 9/00* | (2006.01) |
| *B03B 9/06* | (2006.01) |
| *C30B 35/00* | (2006.01) |

(52) U.S. Cl.
CPC .............. *C01B 33/035* (2013.01); *C23C 16/24* (2013.01); *C23C 16/4418* (2013.01)
USPC .......... 427/248.1; 118/714; 118/70; 156/761; 209/2; 117/200

(58) Field of Classification Search
USPC .......... 118/714, 70; 156/761; 209/2; 117/200
See application file for complete search history.

(56) References Cited

U.S. PATENT DOCUMENTS

| | | | |
|---|---|---|---|
| 5,749,966 | A | 5/1998 | Shates |
| 6,281,098 | B1 | 8/2001 | Wang et al. |
| 7,080,742 | B2 | 7/2006 | Arvidson et al. |

(Continued)

FOREIGN PATENT DOCUMENTS

| | | |
|---|---|---|
| CN | 2016670894 U | 12/2010 |
| DE | 102006035081 A1 | 1/2008 |

(Continued)

OTHER PUBLICATIONS

Poly Plant Project's Advanced 54-Rod CVD Reactor Chosen by Polysilicon Production Plant in China, article, Jul. 6, 2010, 2 pages, Marketwire, Munich, Germany.

(Continued)

*Primary Examiner* — Kelly M Gambetta
(74) *Attorney, Agent, or Firm* — Armstrong Teasdale LLP

(57) ABSTRACT

A tool for harvesting polycrystalline silicon-coated rods from a chemical vapor deposition reactor includes a body including outer walls sized for enclosing the rods within the outer walls. Each outer wall includes a door for allowing access to at least one of the rods.

20 Claims, 13 Drawing Sheets

(56) References Cited

U.S. PATENT DOCUMENTS

2008/0206970 A1    8/2008    Hugo et al.
2010/0001106 A1*   1/2010    Schaefer et al. ............... 241/25
2010/0043972 A1*   2/2010    Baldi et al. .................... 156/344

FOREIGN PATENT DOCUMENTS

| | | |
|---|---|---|
| DE | 102009027830 B3 | 1/2011 |
| EP | 2157051 A2 | 2/2010 |
| JP | 63296840 | 12/1988 |
| JP | 2002210355 | 7/2002 |

OTHER PUBLICATIONS

PCT International Search Report and Written Opinion of the International Searching Authority mailed on Jul. 16, 2012 regarding PCT/EP2012/054719 filed on Mar. 16, 2012; 10 Pages.

* cited by examiner

TOOL FOR HARVESTING POLYCRYSTALLINE SILICON-COATED RODS FROM A CHEMICAL VAPOR DEPOSITION REACTOR

CROSS-REFERENCE

This application claims priority to U.S. Provisional Patent Application No. 61/453,996 filed Mar. 18, 2011, the entire disclosure of which is hereby incorporated by reference in its entirety.

BACKGROUND

Ultrapure polycrystalline silicon used in the electronic and solar industry is often produced through deposition from gaseous reactants via a chemical vapor deposition (CVD) process conducted within a reactor.

FIGS. 1 and 2 show an arrangement of silicon rods 100 within a CVD reactor (the reactor is omitted for clarity). Individual silicon rods 100 are coupled together in pairs by silicon bridges 102. The rods 100 are connected to a plate 104. The plate 104 of rods 100 is disposed within a housing of a CVD reactor. Each pair of coupled rods 100 has a characteristic U-shape. The rods 100 are arranged in three concentric circles. Twelve rods 100 are disposed along the inner circle, 18 rods along the middle circle and 24 rods along the outer circle, for a total of 54 rods.

One such process used to produce ultrapure polycrystalline silicon in a CVD reactor is referred to as a Siemens process. Silicon is deposited on the surface of the rods 100 in this process and the rods 100 are used as seeds to start the process. Gaseous silicon-containing reactants flow through the reactor and deposit silicon onto the surface of the rods 100. The gaseous reactants (i.e., gaseous precursors) are silane-containing compounds such as halosilanes or monosilane and are heated to temperatures above 1000° C. Under these conditions the gaseous reactants decompose on the surface of the rods 100 so that silicon is deposited according to the following overall reaction:

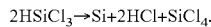

$$2HSiCl_3 \rightarrow Si+2HCl+SiCl_4.$$

The process is stopped after a layer of silicon having a predetermined thickness has been deposited on the surface of the rods 100. The silicon rods are then harvested from the CVD reactor for further processing.

Traditional tools are designed to extract two rods 100 from the CVD reactor in one operation. This tool, commonly known as a "partner", is lowered around one pair of rods 100 at a time and fastened to a portion of the rods. The tool is then lifted to extract the pair of rods 100 from the reactor. The rods are then removed and stored for processing.

Several drawbacks are apparent when using the traditional tool to extract the rods 100 from the CVD reactor. First, the harvesting procedure must be performed many times. For a 54 rod reactor, the procedure has to be performed 27 times, resulting in a time-consuming procedure. Second, the tool is cumbersome and difficult to operate within the narrow spans between the rods 100 and neighboring rods can be damaged during removal of adjacent rods from the reactor. Third, after the first pair of rods 100 has been extracted from the reactor, the tool is unavailable for further use until the extracted pair of rods 100 has cooled because the rods cannot be removed from the tool until they have cooled. This cooling time delays the removal of the remaining rods 100, resulting in a longer shutdown of the reactor. Lastly, it can be difficult to lower the tool along a straight-forward track around the pairs of rods 100 since it cannot be guided easily.

This Background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

One aspect is directed to a tool for harvesting polycrystalline silicon-coated rods from a chemical vapor deposition reactor comprising a body including outer walls sized for enclosing the rods within the outer walls. Each outer wall includes a door for allowing access to at least one of the rods.

Another aspect is directed to a method of harvesting polycrystalline silicon-coated rods from a chemical vapor deposition reactor having a reactor plate. The method comprises positioning a harvesting tool atop the reactor plate, outer walls of tool being disposed outward of the rods. The method further comprises inserting forks into slots of the tool, and holding and detaching the rods form the reactor plate using the forks.

BRIEF DESCRIPTION OF THE DRAWINGS

Like reference symbols in the various drawings indicate like elements.

DETAILED DESCRIPTION

The disclosure is directed to a tool 150 able to extract and safely handle a set of rods 100 from a CVD reactor (i.e., the total number of rods in the reactor) at the same time. In this embodiment, the tool is capable of handling a full or entire set of rods from the reactor, rather than merely a portion of subset of the rods. As described above, when a silicon deposition process reaches its maximum extent or completion, i.e. the thickness of the layer of deposited silicon cannot be increased any further, the rods 100 are removed (i.e., harvested) from the reactor.

The tool 150 described herein is able to simultaneously grasp and extract more than one pair of rods 100 from a CVD reactor. In the example embodiment with a CVD reactor having 54 rods, the tool 150 is capable of removing all of the rods 100 from the reactor simultaneously. The new tool 150 thus reduces the amount of time required to remove the rods 100 from the CVD reactor and increases the throughput of the reactor.

Figure 1:
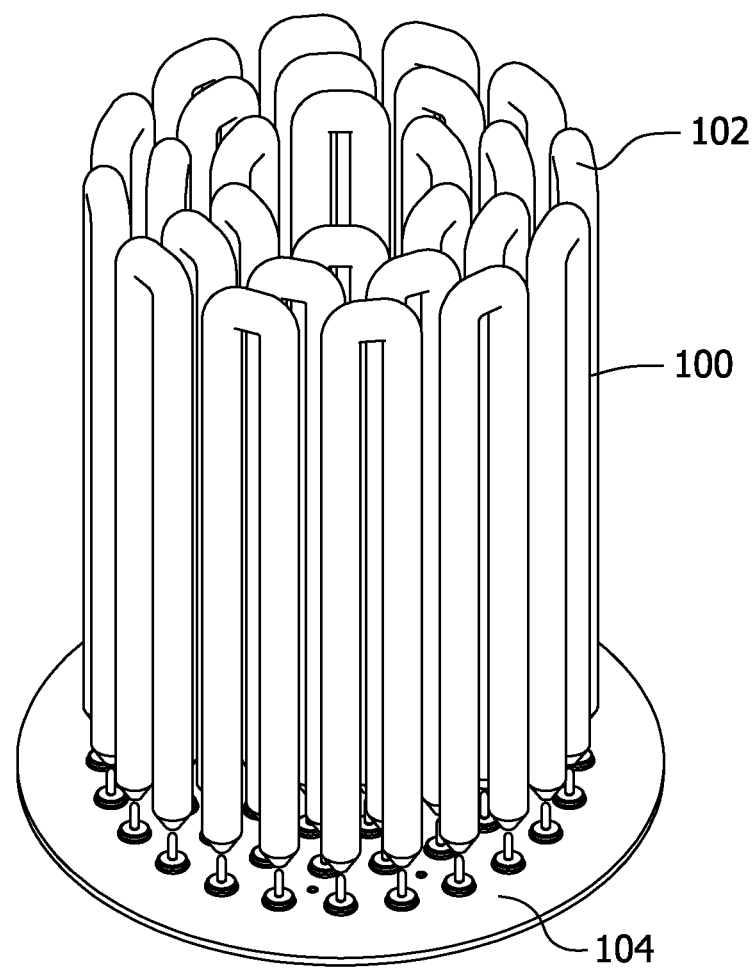
FIG. 1 is a perspective view of a plurality of pairs of rods connected to a plate.
Figure 2:
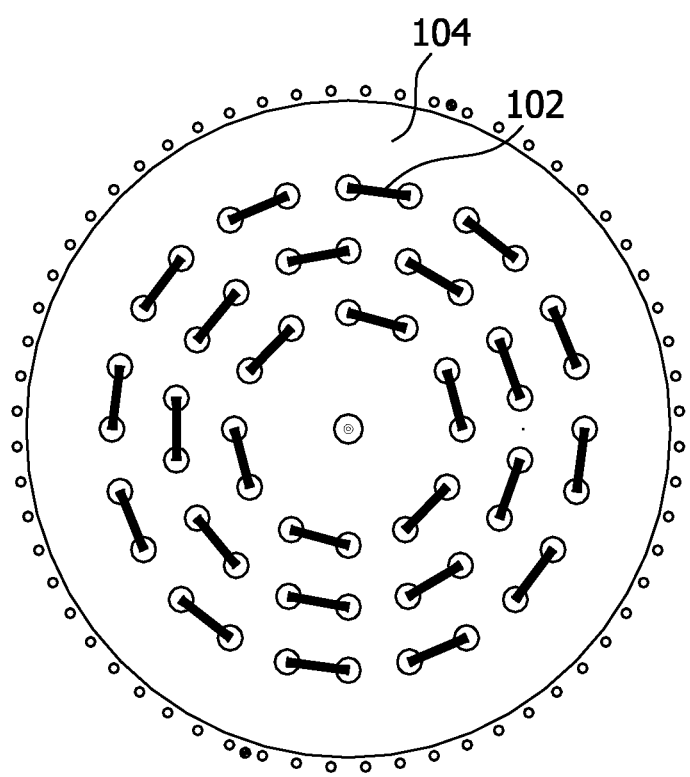
FIG. 2 is a top plan view of FIG. 1.
Figure 3:
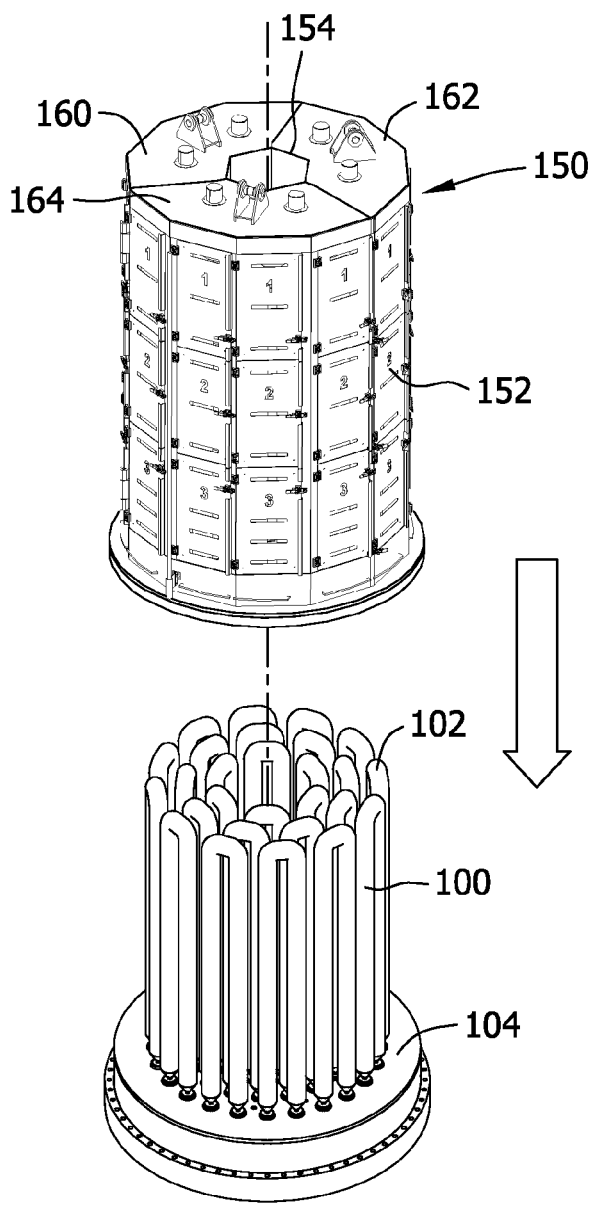
FIG. 3 is a perspective view of FIG. 1 showing a tool for removing the rods from a CVD reactor being lowered over the rods.
Figure 4:
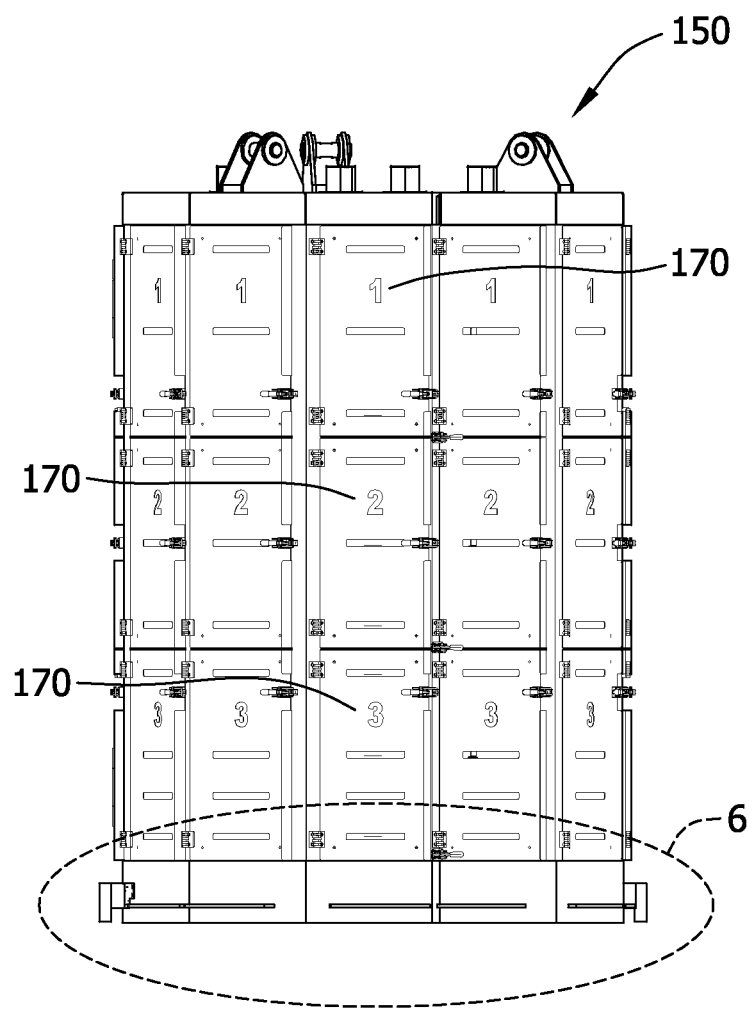
FIG. 4 is a side view of tool lowered in place over the rods.
Figure 5:
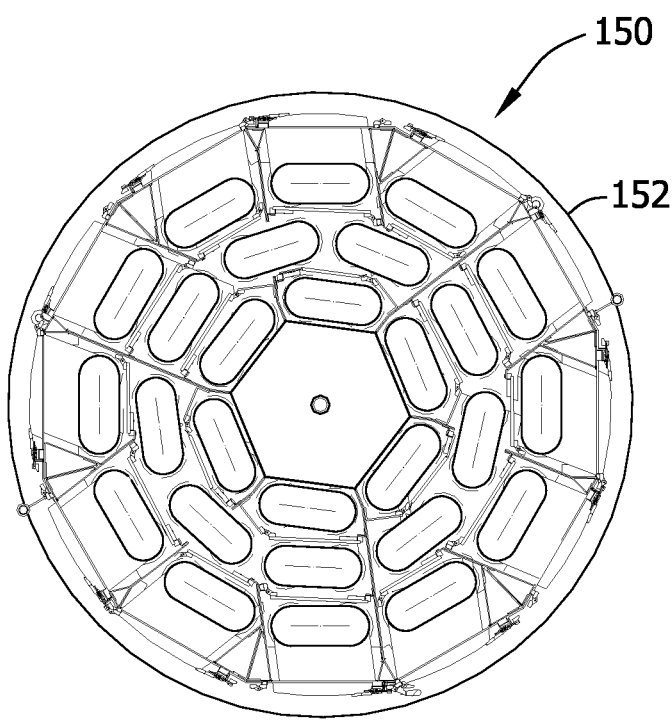
FIG. 5 is a top plan view of FIG. 4 with a top portion of the outer shell removed.

The tool 150 of this embodiment, as shown in FIGS. 3-5, comprises a body, e.g., a metallic structure, with a dodecahedral section 152 which is lowered in between the rods until it rests on the reactor plate 104. The inner metallic walls of the tool 150 are designed to avoid any contact with the silicon bridge 102 coupling each pair of rods 100 while the tool is in motion.

The internal space 154 of the tool 150 is arranged in three large sections 160, 162, 164 (best seen in FIGS. 9 and 12), each of which is sized to hold eighteen rods 100. Each section 160, 162, 164 comprises two cabinets 165 for the inner circle, one cabinet 165 for the middle circle and four cabinets 165 for the outer circle.

As shown in FIGS. 3-5, the tool 150 has a dodecahedral shape. Each side of the tool is equipped with three panels 170 ("floating" panels), and each panel operates as a door to allow operators to access the harvested rods. All the panels 170 are provided with vents, e.g., narrow slits, to expedite rapid cooling of the rods 100.

In order to prevent the tool 150 from bumping into the rods 100 or to avoid misalignments while being lowered the tool is slid along two external shafts 180 (FIG. 7) which guide the tool 150 with respect to the reactor plate 104. The two external shafts 180 are shown only in FIG. 7, where they are also used to guide the tool 150 onto a revolving platform 200, described in greater detail below.

Figure 6:
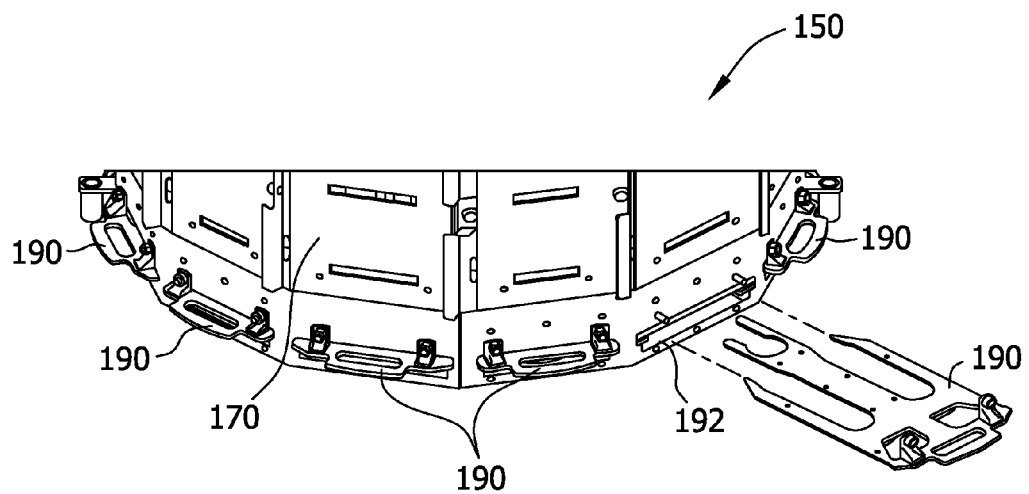
FIG. 6 is a perspective view of an enlarged portion of FIG. 4.

As shown in FIG. 6, once the tool 150 is positioned atop the reactor plate 104, forks 190 are inserted in appropriate slots 192 at the bottom of each section 160, 162, 164 of the tool. The forks 190 detach the rods 100 from the plate 104 and hold the rods while the tool 150 is lifted up from the plate. A total of twelve forks 190 are used in the tool in this embodiment: six forks are designed to hold five rods, whereas the other six forks hold four rods.

Figure 7:
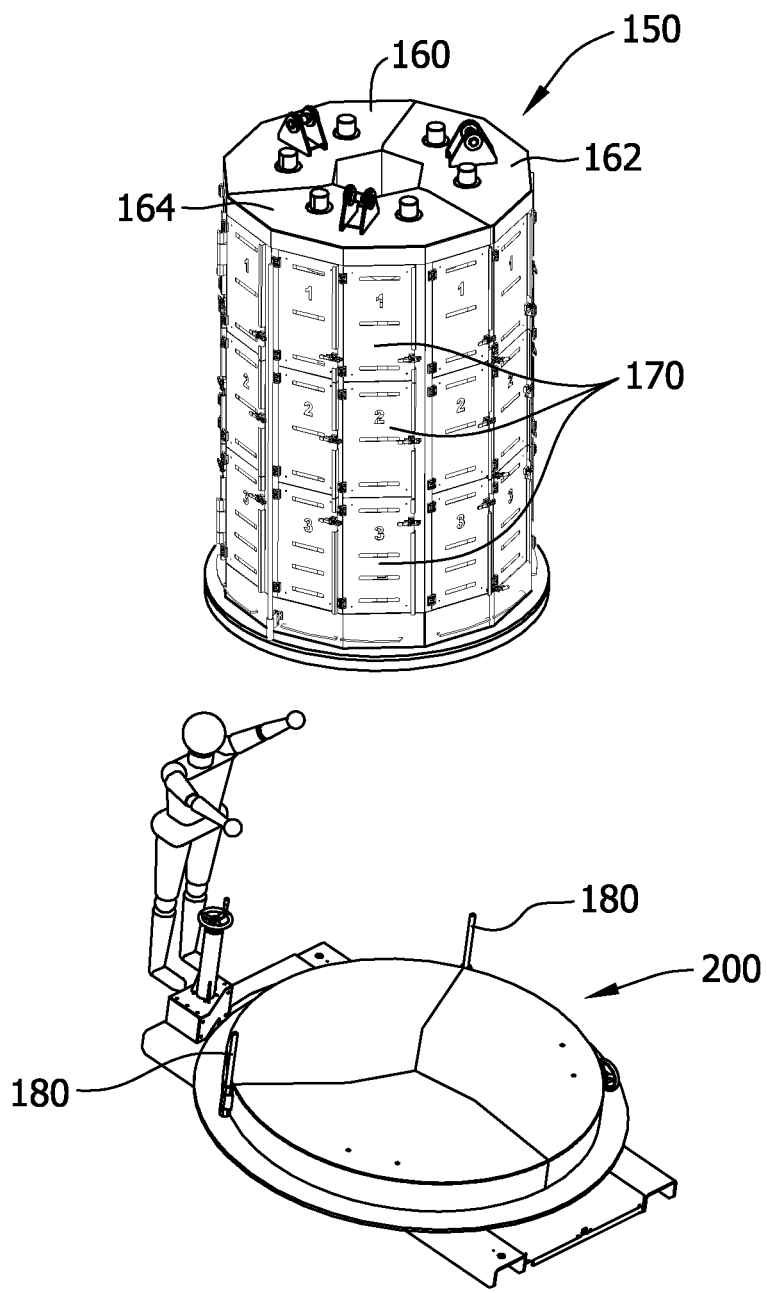
FIG. 7 is a perspective view of the tool and rods of FIG. 4 being lowered onto a revolving platform.
Figure 8:
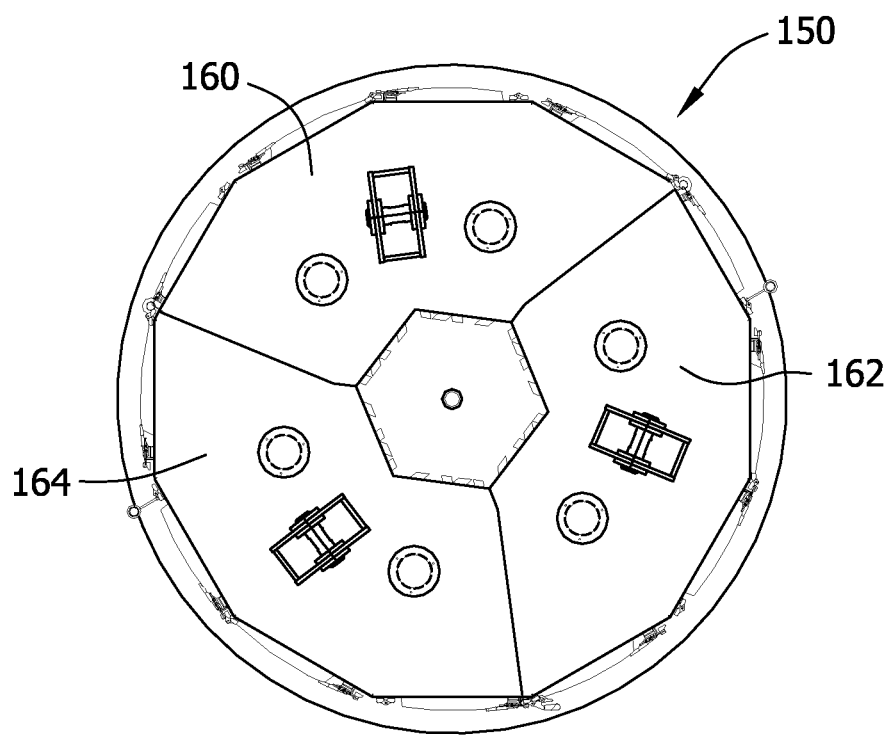
FIG. 8 is a top plan view of tool in a closed configuration.
Figure 9:
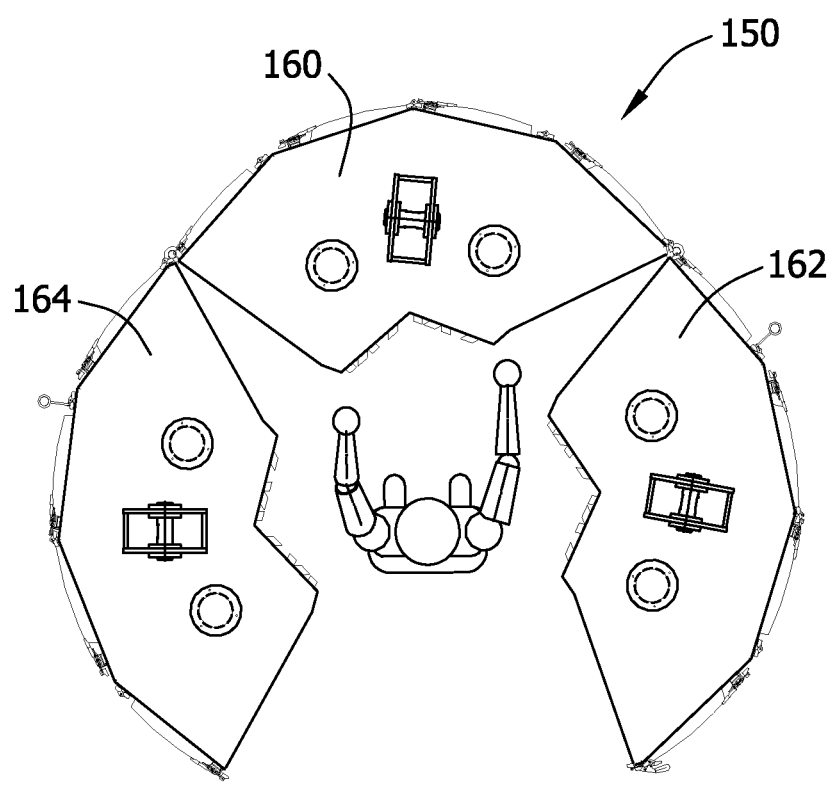
FIG. 9 is a top plan view of the tool of FIG. 8 showing the tool in an open configuration.
Figure 10:
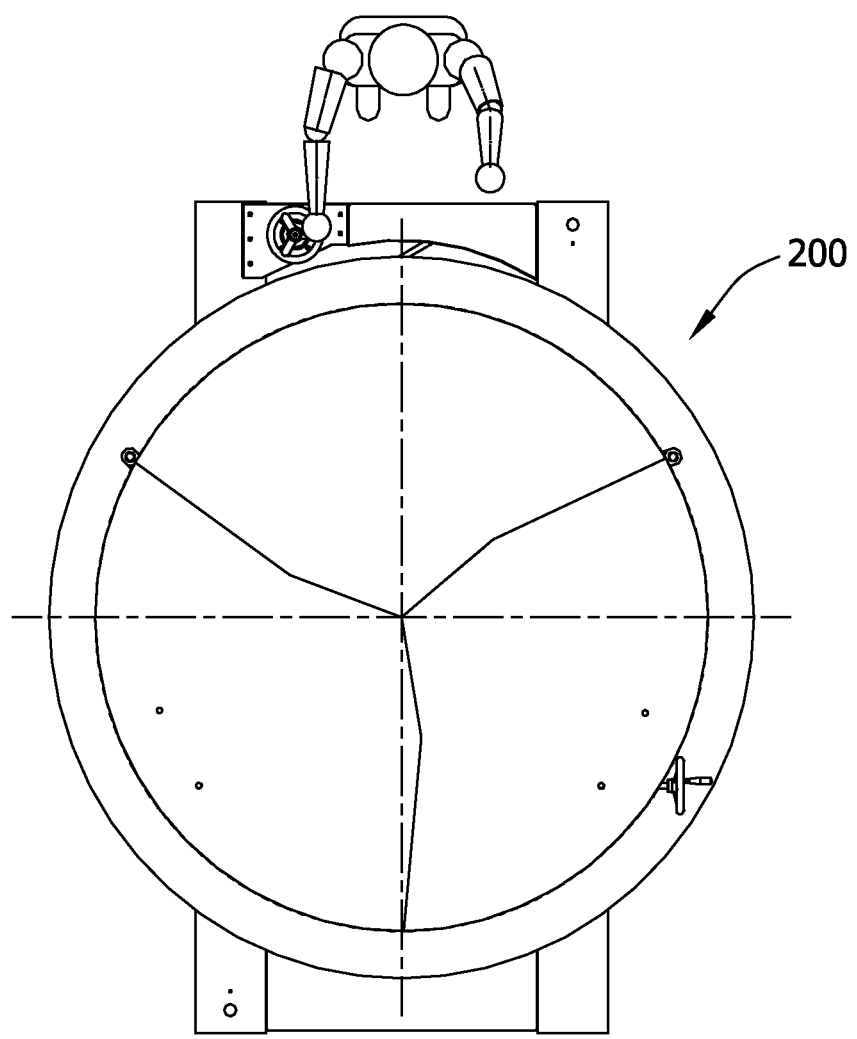
FIG. 10 is a top plan view of the revolving platform of FIG. 7 in a closed configuration.
Figure 11:
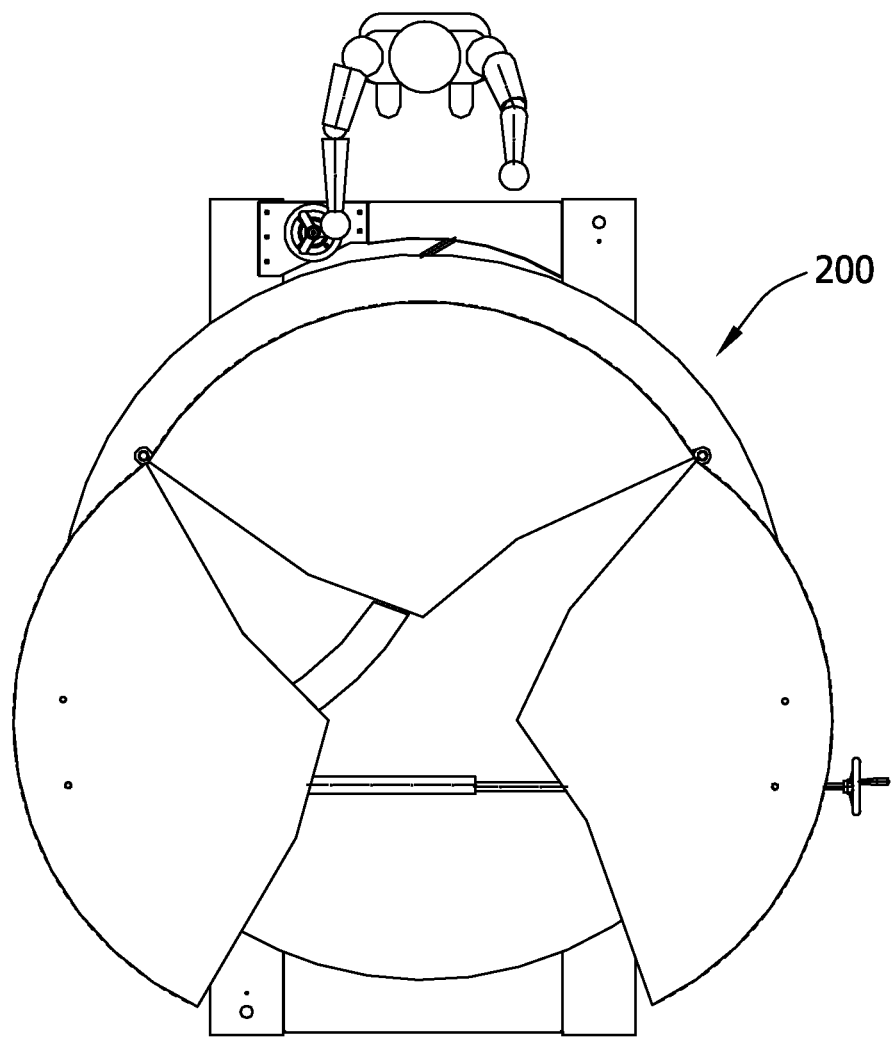
FIG. 11 is a top plan view of the revolving platform of FIG. 10 in an open configuration.
Figure 12:
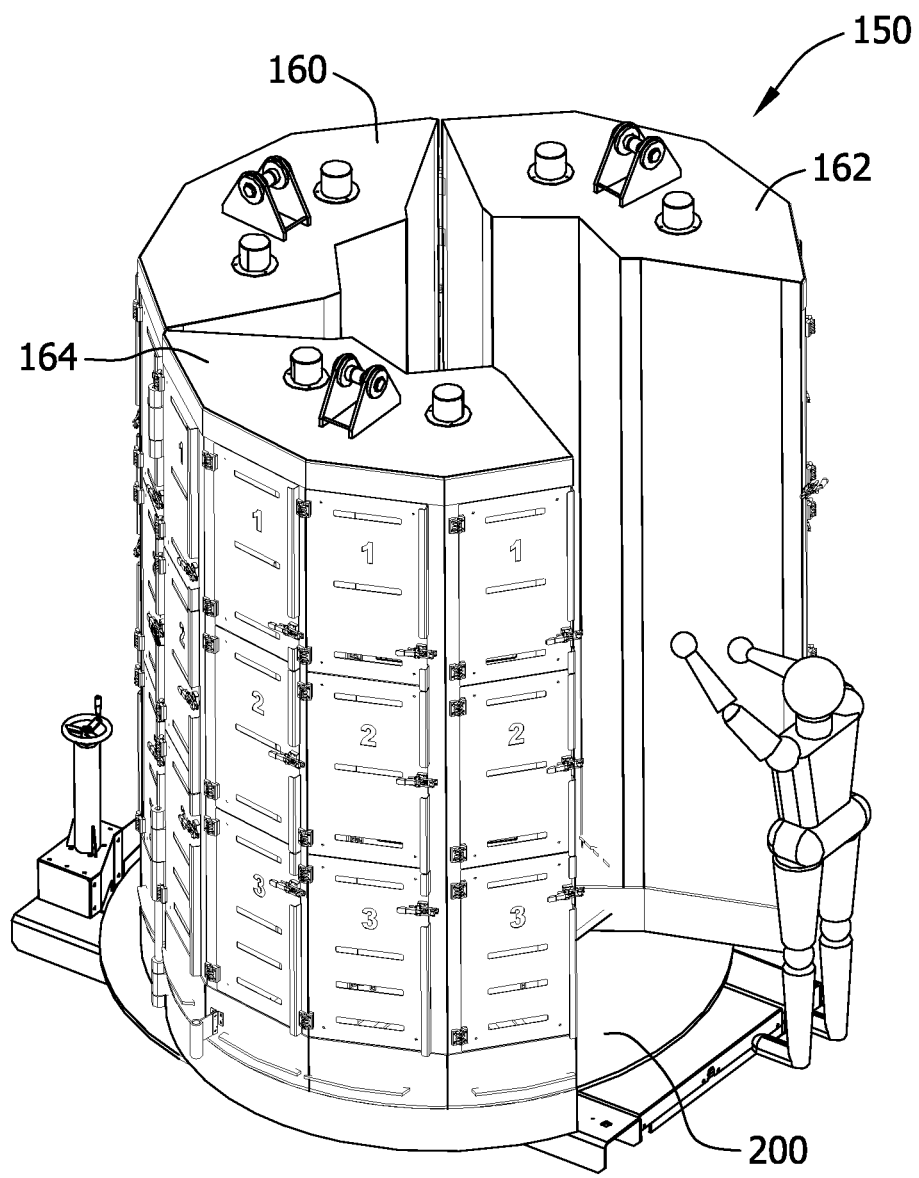
FIG. 12 is a perspective view of the tool and revolving platform in an open configuration.
Figure 13:
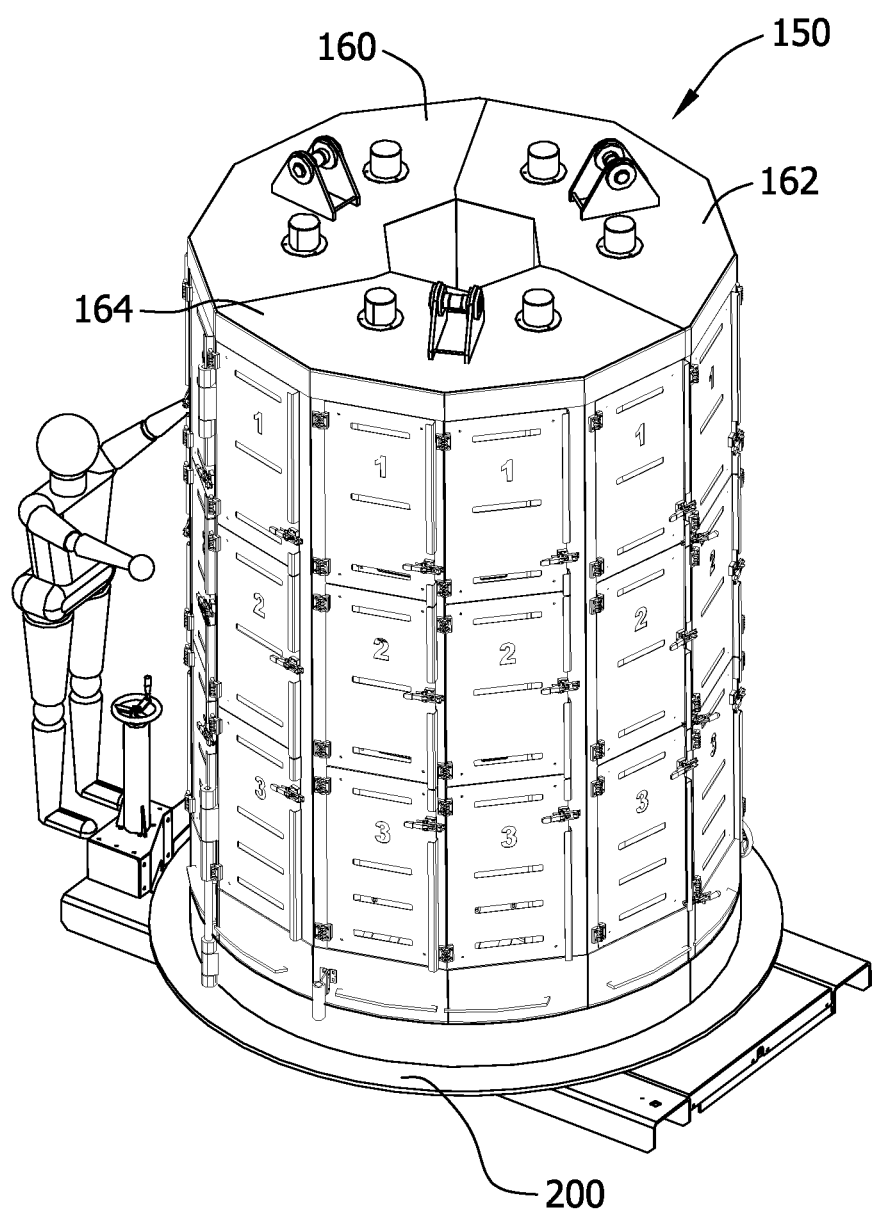
FIG. 13 is a perspective view of the tool and revolving platform in a closed configuration.

The tool 150 is placed on a revolving platform 200 as shown in FIG. 7 after the rods 100 have been removed from the CVD reactor with the tool 150. The first step for harvesting silicon is to open one at a time the outer panels 170 and collect the rods 100 off of the outer ring. FIGS. 9, 11, and 12 show the tool 150 in this open configuration. FIGS. 8, 10, and 13 show the tool 150 in the closed configuration. The system of inner walls which keep the rods 100 segregated permits operators to easily break one single rod at a time into ingots of about 5 kilograms instead of handling a whole one. This step is carried out under safe conditions as breakage of adjacent rods 100 is prevented.

After the removal of the 24 outer rods 100, the second step is the collection of the eighteen rods through the middle doors. The third step consists in the removal of the inner rods 100. To facilitate this operation, two sections 160, 162, or 164 of the tool 150 are opened by means of a mechanism or system disposed inside the revolving platform 200. At the end of the rod 100 extraction, sections 160, 162, 164 and panels 170 are closed, forks 190 are removed and the tool 150 is ready to harvest another set of rods 100 from a CVD reactor.

To avoid silicon contamination from metals on the inner surfaces of the tool 150, the inner surfaces of the tool likely to be in contact with the rods 100 are lined with a polymeric material such as polytetrafluoroethylene (PTFE). Moreover, use of the tool 150 described herein results in the reduced handling of rods 100 compared to known tools. This reduced handling of the rods 100 increases the quality of silicon produced with the CVD reactor as the likelihood of contamination of the silicon is greatly reduced.

As shown in FIG. 9, the operator can enter between the three sections 160, 162, 164, open the inner doors and remove the twelve inner rods 100. This solution results in ergonomic advantages because the distance between the inner rods 100 and the operator's body as shown in FIG. 9 is less than the distance between the inner rods and the operator's body outside the tool 150.

Compared to traditional tools, the tool 150 described above achieves several advantages. First, the down time of the reactor is significantly as the rods 100 are removed in one operation, rather than 27 separate steps. Second, the rods 100 can be left to cool inside the tool 150 whereas with traditional tools this operation takes place with the rods still disposed within the reactor. Second, the quality of the silicon produced is greatly increased as the product handling is reduced to a minimal level. Moreover, parts in contact with the silicon are made from or coated with PTFE. Third, the risk of the rods 100 contacting each other during removal from the reactor is greatly reduced or eliminated since all the rods are withdrawn at the same time and held in place with the forks 490. Fourth, an operator of the tool 150 is able to open the tool and easily access the rods 100 disposed in the center of the tool.

While the invention has been described in terms of various specific embodiments, it will be recognized that the invention can be practiced with modification within the spirit and scope of the claims.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements. The use of terms indicating a particular orientation (e.g., "top", "bottom", "side", etc.) is for convenience of description and does not require any particular orientation of the item described.

As various changes could be made in the above constructions and methods without departing from the scope of the invention, it is intended that all matter contained in the above description and shown in the accompanying drawings shall be interpreted as illustrative and not in a limiting sense.

What is claimed is:

1. A tool for harvesting polycrystalline silicon-coated rods from a chemical vapor deposition reactor comprising:
   a body comprising three sections, each including inner walls and outer walls sized for enclosing the rods in an internal space within the inner and outer walls, where two of the sections open via a revolving platform underlying the body,
   each inner and outer wall including a door for allowing access to at least one of the rods.

2. A tool as set forth in claim 1 including at least 6 outer walls, and wherein each wall includes at least two movable doors.

3. A tool as set forth in claim 1 including at least 10 outer walls, and wherein each wall includes at least three movable doors.

4. A tool as set forth in claim 1 wherein each door is provided with vents to expedite rapid cooling of the rods.

5. A tool as set forth in claim 1 wherein each of the three sections are sized and shaped to hold eighteen rods.

6. A tool as set forth in claim 1 wherein the revolving platform rotates the tool to expedite processing.

7. A tool as set forth in claim 6 further comprising alignment shafts on the revolving platform for facilitating alignment of the tool and inhibiting inadvertent contact with the rods.

8. A tool as set forth in claim 1 wherein the tool has an open configuration and a closed configuration.

9. A tool as set forth in claim 1 further comprising openings in the tool, and forks sized and shaped to be received in the openings and to support at least one of the rods.

10. A tool as set forth in claim 9 wherein each fork is configured to support at least four rods.

11. A tool as set forth in claim 1 wherein inner surfaces of the body are lined with a polymeric material to inhibit contamination.

12. A tool for harvesting polycrystalline silicon-coated rods from a chemical vapor deposition reactor comprising:
   outer walls defining a space for receiving the rods organized in at least one circle; and
   a revolving platform below the space that facilitates opening the space so that at least two of the rods move horizontally apart from each other and relative to an underlying surface.

13. A tool as set forth in claim 12 further comprising a door on each inner and outer wall for allowing access to at least one of the rods.

14. A tool as set forth in claim 13 wherein each door is provided with vents to expedite rapid cooling of the rods.

15. A tool as set forth in claim 12 wherein the revolving platform facilitates closing the space.

16. A tool as set forth in claim 12 further comprising alignment shafts on the revolving platform which facilitate alignment of the tool and inhibit inadvertent contact with the rods.

17. A tool as set forth in claim 12 wherein the space includes at least three sections.

18. A tool as set forth in claim 12 further comprising openings in the tool, and forks sized and shaped to be received in the openings and to support at least one of the rods.

19. A tool as set forth in claim 9 wherein each fork is configured to support at least four rods.

20. A tool as set forth in claim 12 wherein inner surfaces of the walls are lined with a polymeric material to inhibit contamination.

* * * * *